US011482268B2

(12) United States Patent
Vimercati

(10) Patent No.: US 11,482,268 B2
(45) Date of Patent: *Oct. 25, 2022

(54) LEAKAGE COMPENSATION FOR MEMORY ARRAYS

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/387,327

(22) Filed: Jul. 28, 2021

(65) Prior Publication Data

US 2022/0020417 A1    Jan. 20, 2022

Related U.S. Application Data

(63) Continuation of application No. 16/216,057, filed on Dec. 11, 2018, now Pat. No. 11,081,157.

(51) Int. Cl.
*G11C 11/22* (2006.01)
*G11C 11/4096* (2006.01)
(Continued)

(52) U.S. Cl.
CPC ........ *G11C 11/2273* (2013.01); *G11C 11/221* (2013.01); *G11C 11/2259* (2013.01);
(Continued)

(58) Field of Classification Search
CPC combination set(s) only.
See application file for complete search history.

(56) References Cited

U.S. PATENT DOCUMENTS 5,615,144 A * 3/1997 Kimura .................. G11C 11/22
365/117
9,786,345 B1   10/2017 Thiruvengadam et al.
(Continued)

FOREIGN PATENT DOCUMENTS

JP    2001-195885 A    7/2001
JP    2005-093049 A    4/2005
(Continued)

OTHER PUBLICATIONS

ISA/KR, International Search Report and Written Opinion of the International Searching Authority, Int'l Appl. No. PCT/US2019/063395, dated Mar. 19, 2020, Korean Intellectual Property Office, Seo-gu, Daejeon, Republic of Korea, 11 pgs.
(Continued)

*Primary Examiner* — Mohammed A Bashar
(74) *Attorney, Agent, or Firm* — Holland & Hart LLP

(57) ABSTRACT

Apparatuses and techniques for compensating for noise, such as a leakage current, in a memory array are described. Leakage currents may, for example, be introduced onto a digit line from unselected memory cells. In some cases, a compensation component may be coupled with the digit line during a first phase of a read operation, before the target memory cell has been coupled with the digit line. The compensation component may sample a current on the digit line and store a representation of the sampled current. During a second phase of the read operation, the target memory cell may be coupled with the digit line. During the second phase, the compensation component may compensate for leakage or other parasitic effects by outputting a current on the digit line during the read operation based on the stored representation of the sampled current.

20 Claims, 8 Drawing Sheets

(51) Int. Cl.
  *G11C 11/4091* (2006.01)
  *G11C 11/408* (2006.01)

(52) U.S. Cl.
  CPC ...... *G11C 11/4091* (2013.01); *G11C 11/4096* (2013.01); *G11C 11/2255* (2013.01); *G11C 11/2257* (2013.01); *G11C 11/4087* (2013.01)

(56) References Cited

U.S. PATENT DOCUMENTS

| | | |
|---|---|---|
| 10,453,532 B1 | 10/2019 | Antonyan |
| 2001/0007537 A1 | 7/2001 | Agawa et al. |
| 2005/0057974 A1 | 3/2005 | Smith et al. |
| 2006/0002193 A1 | 1/2006 | Smith et al. |
| 2006/0181915 A1 | 8/2006 | Oh et al. |
| 2010/0278002 A1 | 11/2010 | Chen et al. |
| 2014/0286079 A1 | 9/2014 | Domae et al. |
| 2016/0093372 A1 | 3/2016 | Fainzilber et al. |
| 2016/0125937 A1 | 5/2016 | Kang |
| 2016/0125940 A1 | 5/2016 | Kang |
| 2019/0378567 A1* | 12/2019 | Gangasani ......... G11C 13/0038 |

FOREIGN PATENT DOCUMENTS

| | | |
|---|---|---|
| JP | 2006-228414 A | 8/2006 |
| KR | 101674803 B1 | 11/2016 |
| WO | 2012067661 A1 | 5/2012 |

OTHER PUBLICATIONS

European Patent Office, "Supplementary European search report and Search Opinion", issued in connection with European Patent Application No. 19895394.5 dated Jul. 28, 2022 (9 pages).

Japan Patent Office, "Notice of Rejection Ground", issued in connection with Japan Patent Application No. 2021-531899 dated Aug. 2, 2022 (20 pages).

* cited by examiner

US 11,482,268 B2

LEAKAGE COMPENSATION FOR MEMORY ARRAYS

CROSS REFERENCE

The present Application for Patent is a continuation of U.S. patent application Ser. No. 16/216,057 by Vimercati, entitled "LEAKAGE COMPENSATION FOR MEMORY ARRAYS," filed Dec. 11, 2018, assigned to the assignee hereof, and is expressly incorporated by reference in its entirety herein.

BACKGROUND

The following relates generally to a system that includes at least one memory device and more specifically to leakage compensation for memory arrays.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., flash memory, MRAM, FeRAM, may maintain their stored logic state for extended periods of time even in the absence of an external power source. Volatile memory devices, e.g., DRAM, SRAM, may lose their stored state when disconnected from an external power source. Dynamic memory devices, e.g., DRAM, SDRAM, may store charge on a capacitor or other passive storage element and lose a stored state over time unless they are periodically refreshed. FeRAM may use similar device architectures as volatile memory but may have non-volatile properties due to the use of a ferroelectric capacitor as a storage device. FeRAM devices may thus provide some of the density advantages of dynamic or volatile memory while retaining the benefits of non-volatile memory.

In some cases, a digit line used to read the state of a memory cell may be subject to noise (e.g., parasitic effects) from various sources. Such noise may include leakage current through unselected memory cells on the digit line or from other sources, and may reduce the accuracy of read operations. In particular, noise such as leakage current may present challenges for increasing memory density for FeRAM devices.

DETAILED DESCRIPTION

Figure 1:
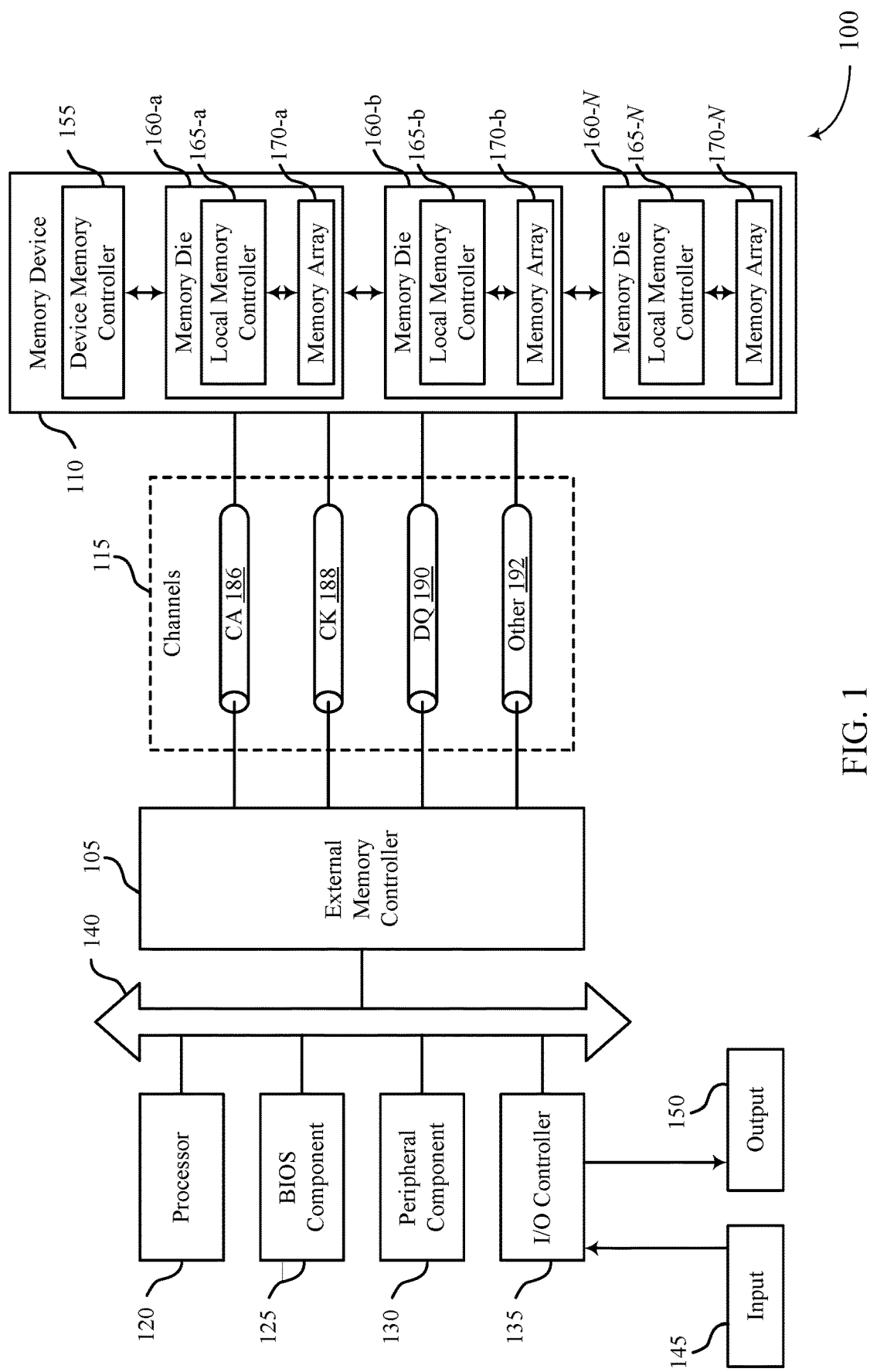
FIG. 1 illustrates an example of a system that supports leakage compensation for memory arrays as disclosed herein.

A memory device may include multiple memory cells that may be selectively coupled with a digit line. Each memory cell may include a cell selector component that may be activated to select the memory cell and couple the memory cell with the digit line during a read operation. The selected memory cell may transfer charge to (or from) the digit line, thereby causing a signal to develop on the digit line. The signal may represent the logic state stored by the selected memory cell and may be used by a sense component to determine the logic state of the selected memory cell during the read operation.

In some cases, a read operation may include one or more phases. For example, a read operation may include a first phase during which the digit line may be pre-charged to a particular voltage before the target memory cell is coupled with the digit line, and a second phase during which the target memory cell is coupled with the digit line and a signal from the target memory cell develops on the digit line. A sense component may determine the logic state of the memory cell during or after the second phase.

In some cases, noise (e.g., a parasitic or otherwise undesired charge, current, voltage, or other effect) may be present on the digit line during the first and second phases of the read operation. Such noise may arise from various sources, including leakage current through the cell selector components of unselected memory cells. In some cases, such noise may reduce the accuracy of the read operation by distorting the signal on the digit line.

According to various examples described herein, a memory device may include a compensation component to compensate for noise on the digit line, such as leakage current. For simplicity, the term "leakage current" as used herein may refer to leakage current associated with unselected memory cells, leakage current from other components, or undesired current from various other noise sources.

In some cases, the compensation component may, during the first phase of the read operation (e.g., before the target memory cell is coupled with the digit line), sample a leakage current on the digit line and store a representation of the leakage current. The compensation component may store the representation of the leakage current as a voltage on a capacitor, for example, or in another manner. In some cases, the compensation component may, during the second phase (e.g., after the target memory cell is coupled with the digit line), compensate for the leakage current by removing some or all of the leakage current from the digit line based on the stored representation of the leakage current. Thus, the compensation component may adjust its output current based on the stored representation of the leakage current.

In some cases, the compensation component may remove the leakage current by sinking (or sourcing, depending on the polarity of the circuit) a current that is substantially equivalent to the leakage current based on the stored representation of the leakage current. For example, the compensation component may include a transconductance circuit whose input nodes may be coupled with the nodes of a capacitor used for storing the representation of the leakage current, thereby providing the representation of the leakage current as an input to the transconductance circuit. The output node of the transconductance circuit may be coupled with the digit line. Such an arrangement may cause the transconductance circuit to sink (or source) the noise current on the digit line during the second portion of the read operation, thereby providing leakage compensation. Other implementations of a compensation component may be used; for example, a sample-and-hold circuit or current mirror circuit may be used to provide similar functionality.

The leakage compensation approach described herein may improve the reliability or speed of a read operation by reducing or eliminating the effects of leakage current or other noise on the digit line during the read operation.

Features of the disclosure are initially described in the context of a memory system and related component operations as described with reference to FIGS. 1-3. Features of the disclosure are described further in the context of a memory die that includes multiple memory cells, which may include ferroelectric memory cells as described with reference to FIGS. 4-6. These and other features of the disclosure are further illustrated by and described with reference to timing diagrams, apparatus diagrams, system diagrams, and flowcharts that relate to leakage compensation for a memory array as described with reference to FIGS. 7-8.

FIG. 1 illustrates an example of a system 100 that may include one or more memory devices as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include features of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes, such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on a printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, a system 100 or memory device 110 may be configured to store, during a first phase of a read operation of a target memory cell, a representation of a leakage current for a digit line. The system or memory device may be configured to couple, during a second phase of the read operation, the target memory cell with the digit line, and output, during the second phase of the read operation, a current on the digit line based at least in part on the representation of the leakage current. The system or memory device may be configured to determine a logic state stored by the target memory cell based at least in part on a signal on the digit line during the second phase of the read operation.

Figure 2:
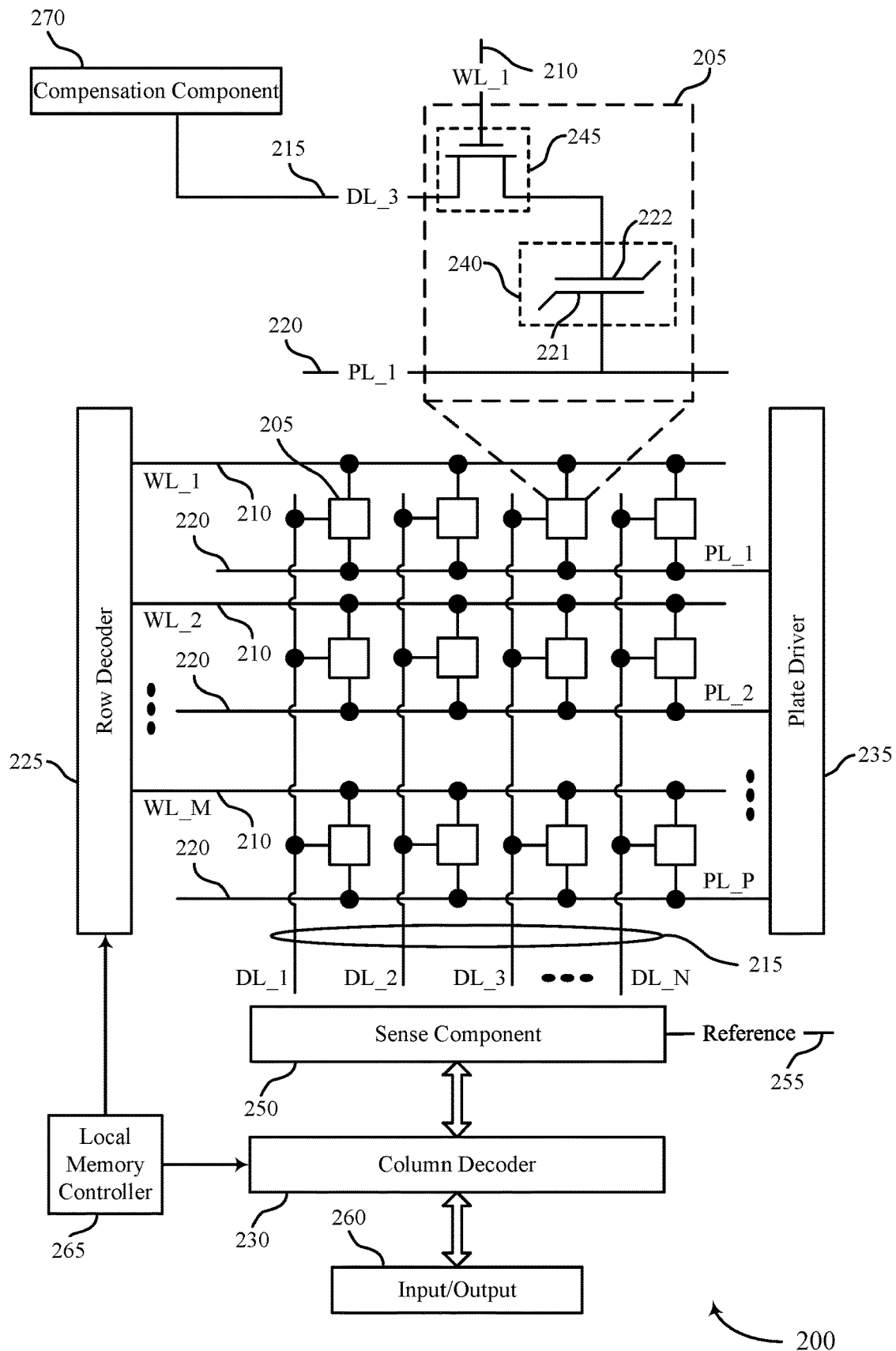
FIG. 2 illustrates an example of a memory die that supports leakage compensation for memory arrays as disclosed herein.
Figure 3:
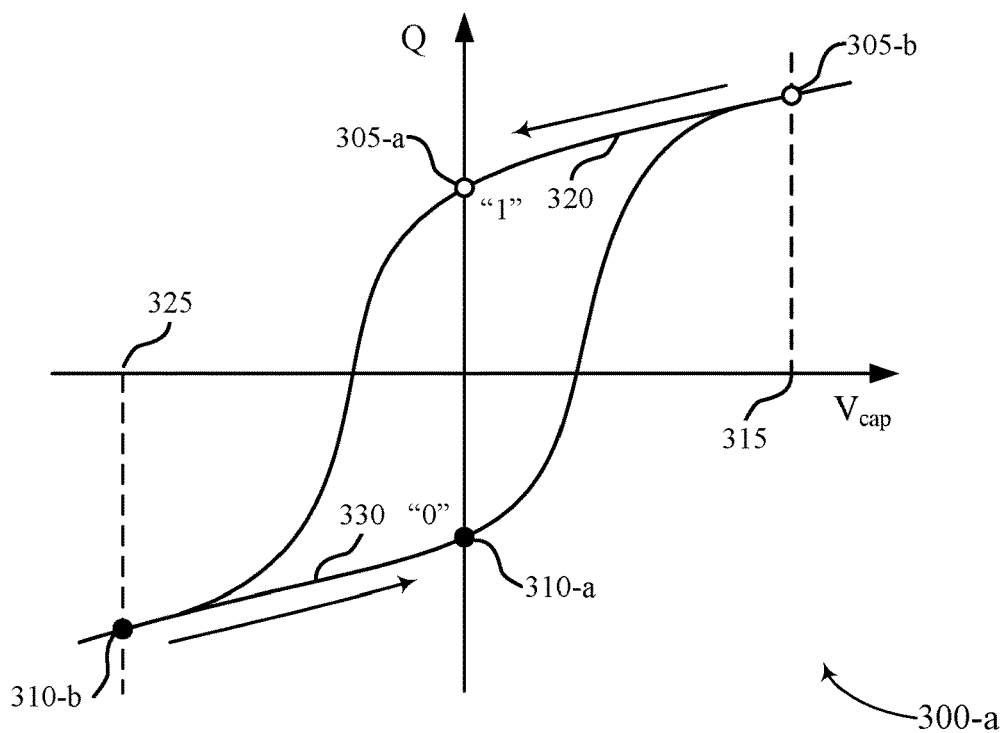
FIGS. 3A and 3B illustrate example hysteresis plots for a ferroelectric memory cell that supports leakage compensation for memory arrays as disclosed herein.
Figure 3:
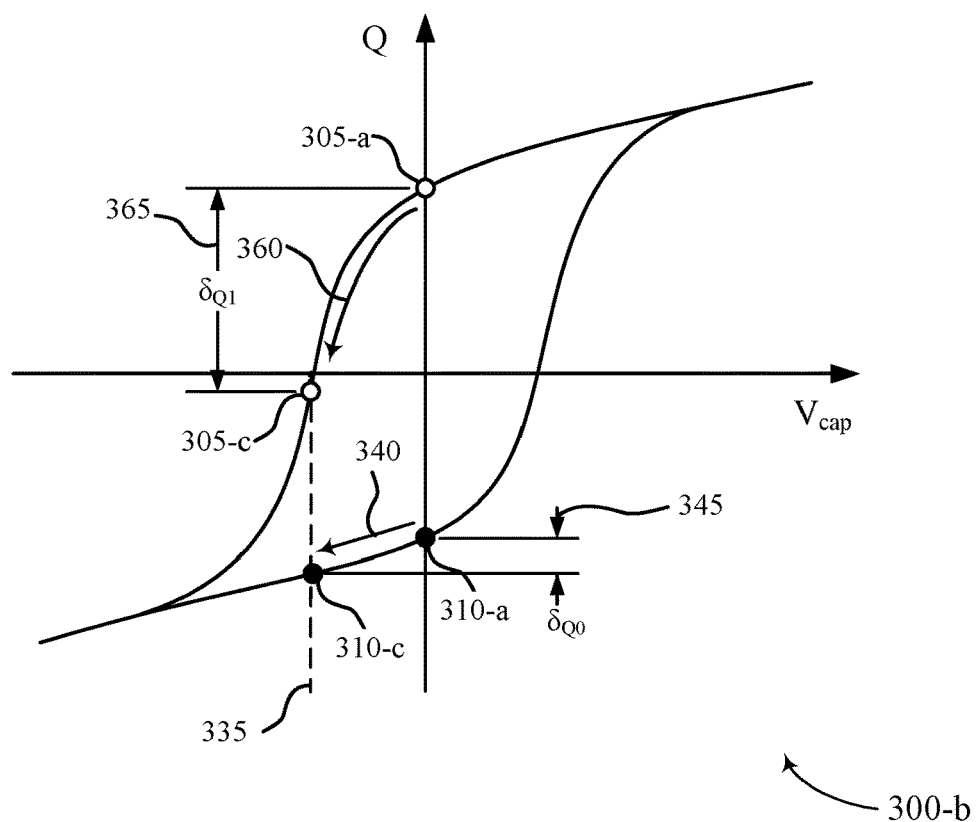

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and/or a plate line 220 (e.g., applying a voltage to the word line 210, digit line 215, and/or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a cell selector component 245. The capacitor 240 may be an example of a ferroelectric capacitor. A first node of the capacitor 240 may be coupled with the cell selector component 245 and a second node of the capacitor 240 may be coupled with a plate line 220. The cell selector component 245 may be a device that selectively couples or de-couples a memory cell 205 with a digit line 215. In some cases, the cell selector component 245 may be a p-type transistor or an n-type transistor. In some cases, the cell selector component 245 may be a thin-film transistor (TFT). In some cases, a TFT transistor may include a transistor formed in an epitaxial layer or a transistor formed using silicon-on-insulator technology, for example.

Selecting or deselecting the memory cell 205 may be accomplished by activating or deactivating the cell selector component 245. The capacitor 240 may be in electronic communication with the digit line 215 using the cell selector component 245. For example, the capacitor 240 may be isolated from digit line 215 when the cell selector component 245 is deactivated, and the capacitor 240 may be coupled with digit line 215 when the cell selector component 245 is activated. In some cases, the cell selector component 245 may be a switching component such as a transistor, and its operation is controlled by applying a voltage to a transistor gate, where the voltage differential between the transistor gate and transistor source is greater or less than a threshold voltage of the transistor. As described herein, in some cases, the cell selector component 245 may experience a leakage current when the cell selector component 245 is deactivated. The leakage current may contribute to noise on digit line 215.

A word line 210 may be a conductive line in electronic communication with a memory cell 205 that is used to perform access operations on the memory cell 205. In some architectures, the word line 210 may be in electronic communication with a cell selector component 245 of a memory cell 205 and may be configured to control the cell selector component 245 of the memory cell. The word line 210 may activate/deactivate the cell selector component 245 based on a voltage being applied to word line 210. In some cases, word line 210 may be coupled with a gate of a transistor of the cell selector component 245, for example. Each word line 210 may activate multiple cell selector components 245 for some quantity of columns.

A digit line 215 may be a conductive line that connects the memory cell 205 with a sense component 250. In some architectures, the memory cell 205 may be selectively coupled with the digit line 215 during portions of an access operation, such as a read operation or write operation. For example, the word line 210 and the cell selector component 245 of the memory cell 205 may be configured to selectively couple and/or isolate the capacitor 240 of the memory cell 205 with the digit line 215.

In some cases, the cell selector component 245 may permit a leakage current to flow through the cell selector component 245 onto the digit line 215 when the memory cell 205 is not selected (e.g., when cell selector component 245 is not activated). For example, if cell selector component 245 is a transistor, the leakage current across cell selector component 245 may include a leakage current (e.g., an off-state current) through the channel of the transistor from the drain to the source (or vice versa), and/or a leakage current from the gate to the drain or source. Such leakage current may constitute a relatively small amount of current for each memory cell 205, but the sum of the leakage currents for multiple memory cells 205 coupled with a digit line 215 may result in a sum of leakage current onto digit line 215 that is sufficient to distort or corrupt the signal on the digit line and reduce the accuracy of read operations for memory cells 205 associated with digit line 215. TFTs and other types of switching components (including cell selector components) that are fabricated with relatively small feature sizes and operate at relatively low voltages may be particularly susceptible to experiencing leakage current, for example.

Figure 4:
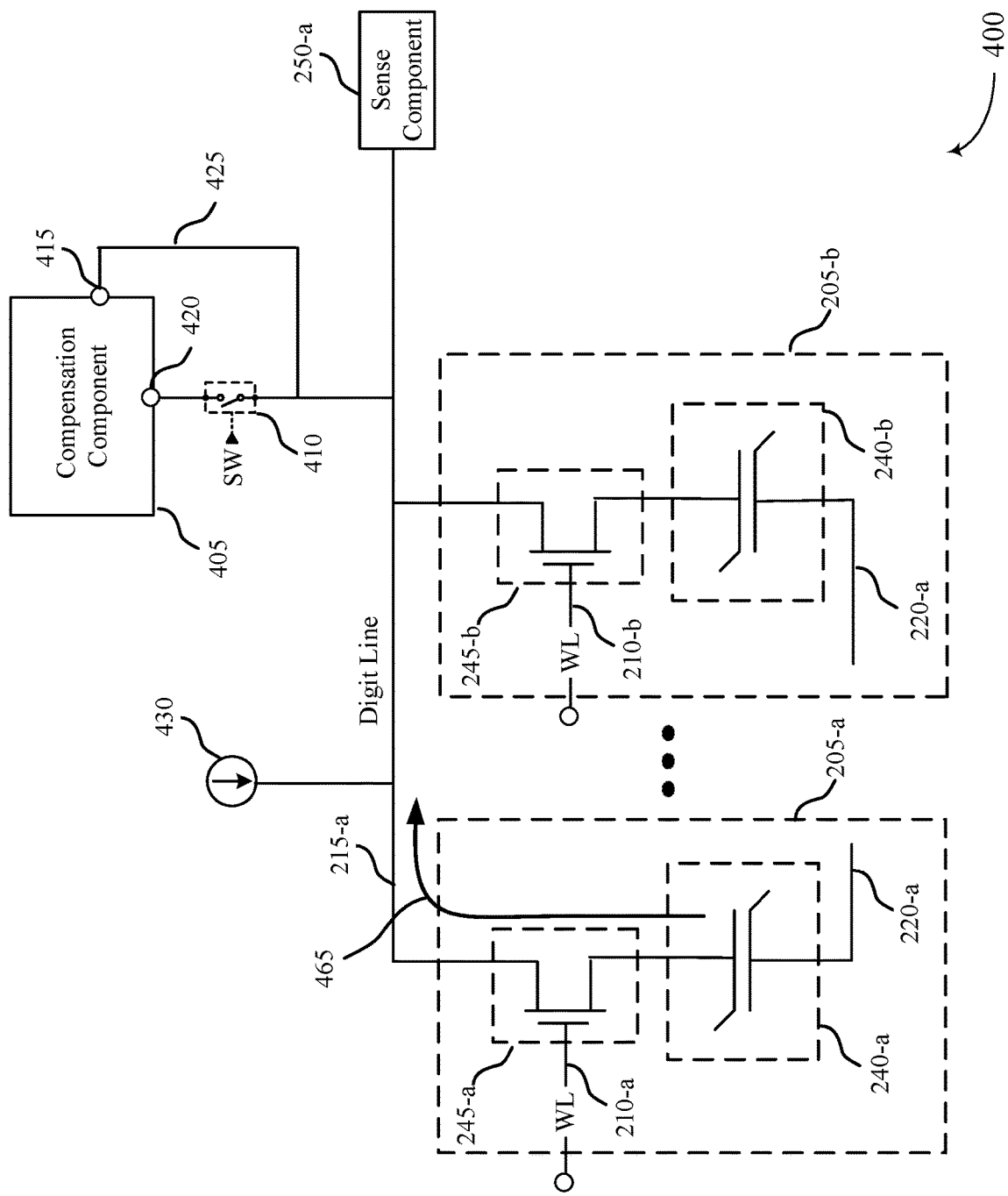
FIG. 4 illustrates an example circuit that supports leakage compensation for memory arrays as disclosed herein.

According to various examples, the memory die 200 or another portion of the memory device may include a compensation component 270 that may compensate for leakage currents through cell selector components 245 during a read operation of a memory cell 205, as described in more detail with respect to FIG. 4.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to detect a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205, which may be a charge signal, current signal, or voltage signal. For example, a sense amplifier may detect minute changes in the charge of a digit line 215 during a read operation and may produce signals corresponding to either a logic 0 or a logic 1 based on the detected charge. The sense component 250 may be configured to compare the signal on the digit line 215 or the produce signal to a reference signal 255 (e.g., a reference voltage). The sense component 250 may determine the stored state of the memory cell 205 based on the comparison. For example, for memory cells capable of storing one of two states, if digit line 215 or a corresponding signal produced by a sense amplifier has a higher voltage than the reference signal 255, the sense component 250 may determine that the stored state of memory cell 205 is a logic 1, and if the digit line 215 or a corresponding signal produced by a sense amplifier has a lower voltage than the reference signal 255, the sense component 250 may determine that the stored state of the memory cell 205 is a logic 0.

The sense component 250 may include various transistors or amplifiers to detect and amplify a difference in the signals (e.g., a difference between a signal from the memory cell and a reference signal). However, if there is noise on the digit line 215 during the read operation (e.g., from leakage currents or other sources), the sense component 250 may not be able to accurately determine the state stored on the memory cell. According to various examples, a memory device may include a compensation component 270 to compensate for noise on the digit line 215 and provide a cleaner signal to the sense component 250.

The detected logic state of memory cell 205 may be output through column decoder 230 as output 260. In some cases, the sense component 250 may be part of another component (e.g., a column decoder 230, row decoder 225). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the digit line 215 may be pre-charged using a compensation component 270 configured to compensate for leakage current on digit line 215, as described herein. In some cases, the compensation component 270 may be used to pre-charge the digit line 215 to a target voltage before coupling a memory cell 205 with the digit line 215. In some cases, the digit line 215 may be initially pre-charged to a first voltage using, for example, a voltage source that provides the target voltage and is coupled with the digit line 215 via a switch, and the compensation component 270 may be used to finish pre-charging the digit line 215 to the target voltage (e.g., compensating for the leakage current) once the switch disconnects the voltage source from the digit line 215.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some cases, the local memory controller 265, a device memory controller, or an external memory controller may cause a compensation component 270 to store, during a read operation, a representation of a leakage current on a digit line 215 and compensate for the leakage current by outputting the leakage current on the digit line 215 during the read operation.

FIGS. 3A and 3B illustrate example hysteresis plots 300-$a$ and 300-$b$ depicting examples of non-linear electrical properties for a memory cell 205 that supports leakage compensation for memory arrays as disclosed herein. The hysteresis plots 300-$a$ and 300-$b$ may illustrate an example writing process and reading process, respectively, for a memory cell 205 employing a ferroelectric capacitor 240 as described with reference to FIG. 2. The hysteresis plots 300-$a$ and 300-$b$ depict the charge, Q, stored on the ferroelectric capacitor 240 as a function of a voltage difference $V_{cap}$, between the terminals of the ferroelectric capacitor 240 (e.g., when charge is permitted to flow into or out of the ferroelectric capacitor 240 according to the voltage difference $V_{cap}$). For example, the voltage difference $V_{cap}$ may represent the difference in voltage between a digit line side of the capacitor 240 and a plate line side of the capacitor 240.

A ferroelectric material is characterized by a spontaneous electric polarization, where the material may maintain a non-zero electric charge in the absence of an electric field. Examples of ferroelectric materials include barium titanate (BaTiO3), lead titanate (PbTiO3), lead zirconium titanate (PZT), and strontium bismuth tantalate (SBT). Ferroelectric capacitors 240 described herein may include these or other ferroelectric materials. Electric polarization within a ferroelectric capacitor 240 results in a net charge at the surface of the ferroelectric material, and attracts opposite charge through the terminals of the ferroelectric capacitor 240. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in some DRAM arrays. Employing ferroelectric materials may reduce the need to perform refresh operations as described above for some DRAM architectures, such that maintaining logic states of an FeRAM architecture may be associated with substantially lower power consumption than maintaining logic states of a DRAM architecture.

The hysteresis plots 300-$a$ and 300-$b$ may be understood from the perspective of a single terminal of a ferroelectric capacitor 240. By way of example, if the ferroelectric material has a negative polarization, positive charge accumulates at the associated terminal of the ferroelectric capacitor 240. Likewise, if the ferroelectric material has a positive polarization, a negative charge accumulates at the associated terminal of the ferroelectric capacitor 240.

Additionally, it should be understood that the voltages in the hysteresis plots 300-$a$ and 300-$b$ represent a voltage difference across the capacitor (e.g., an electric potential between the terminals of the ferroelectric capacitor 240) and are directional. For example, a positive voltage may be realized by applying a positive voltage to a first terminal 222 and maintaining a second terminal 221 at ground or virtual ground (or approximately zero volts (0V)). In some examples, a negative voltage may be applied by maintaining the first terminal at ground and applying a positive voltage to the second terminal 221 (e.g., via plate voltage 220). In other words, positive voltages may be applied to arrive at a negative voltage difference $V_{cap}$ across the ferroelectric capacitor 240 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-$a$ and 300-$b$.

As depicted in the hysteresis plot 300-$a$, a ferroelectric material used in a ferroelectric capacitor 240 may maintain a positive or negative polarization when there is no net voltage difference between the terminals of the ferroelectric capacitor 240. For example, the hysteresis plot 300-$a$ illustrates two possible polarization states, a charge state 305-*b* and a charge state 310-*b*, which may represent a positively saturated polarization state and a negatively saturated polarization state, respectively. The charge states 305-*a* and 310-*a* may be at a physical condition illustrating remnant polarization (Pr) values, which may refer to the polarization (or charge) that remains upon removing the external bias (e.g., voltage). The coercive voltage is the voltage at which the charge or polarization is zero. According to the example of the hysteresis plot 300-*a*, the charge state 305-*a* may represent a logic 1 when no voltage difference is applied across the ferroelectric capacitor 240, and the charge state 310-*a* may represent a logic 0 when no voltage difference is applied across the ferroelectric capacitor 240. In some examples, the logic values of the respective charge states may be reversed to accommodate other schemes for operating a memory cell 205.

A logic 0 or 1 may be written to the memory cell by controlling the electric polarization of the ferroelectric material, and thus the charge on the capacitor terminals, by applying a net voltage difference across the ferroelectric capacitor 240. For example, the voltage 315 may be a voltage equal to or greater than a positive saturation voltage, and applying the voltage 315 across the ferroelectric capacitor 240 may result in charge accumulation until the charge state 305-*b* is reached (e.g., writing a logic 1). Upon removing the voltage 315 from the ferroelectric capacitor 240 (e.g., applying a zero net voltage across the terminals of the ferroelectric capacitor 240), the charge state of the ferroelectric capacitor 240 may follow the path 320 shown between the charge state 305-*b* and the charge state 305-*a* at zero voltage across the capacitor. In other words, charge state 305-*a* may represent a logic 1 state at an equalized voltage across a ferroelectric capacitor 240 that has been positively saturated.

Similarly, voltage 325 may be a voltage equal to or lesser than a negative saturation voltage, and applying the voltage 325 across the ferroelectric capacitor 240 may result in charge accumulation until the charge state 310-*b* is reached (e.g., writing a logic 0). Upon removing the voltage 325 from the ferroelectric capacitor 240 (e.g., applying a zero net voltage across the terminals of the ferroelectric capacitor 240), the charge state of the ferroelectric capacitor 240 may follow the path 330 shown between the charge state 310-*b* and the charge state 310-*a* at zero voltage across the capacitor. In other words, charge state 310-*a* may represent a logic 0 state at an equalized voltage across a ferroelectric capacitor 240 that has been negatively saturated. In some examples, the voltage 315 and the voltage 325, representing saturation voltages, may have the same magnitude, but opposite polarity across the ferroelectric capacitor 240.

To read, or sense, the stored state of a ferroelectric capacitor 240, a voltage may also be applied across the ferroelectric capacitor 240. In response to the applied voltage, the subsequent charge Q stored by the ferroelectric capacitor changes, and the degree of the change may depend on the initial polarization state, the applied voltages, intrinsic capacitance on access lines, and other factors. In other words, the charge state resulting from a read operation may depend on whether the charge state 305-*a*, or the charge state 310-*a*, or some other charge state was initially stored, among other factors.

The hysteresis plot 300-*b* illustrates an example of access operations for reading stored charge states 305-*a* and 310-*a*. A read voltage 335 may be applied, for example, as a voltage difference via a digit line 215 and a plate line 220 as described with reference to FIG. 2. The hysteresis plot 300-*b* may illustrate read operations where the read voltage 335 is negative. A negative read voltage across the ferroelectric capacitor 240 may be referred to as a "plate high" read operation, where a plate line 220 is taken initially to a higher voltage (e.g., above a ground voltage), and a digit line 215 is initially at a lower voltage (e.g., lower than the plate line, a ground voltage). Although the read voltage 335 is shown as a negative voltage across the ferroelectric capacitor 240, in alternative access operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a cell selector component 245 via a word line 210 as described with reference to FIG. 2). Upon applying the read voltage 335 to the ferroelectric capacitor 240, charge may flow into or out of the ferroelectric capacitor 240 via the associated digit line 215 and plate line 220, and different charge states may result depending on whether the ferroelectric capacitor 240 was at the charge state 305-*a* (e.g., a logic 1) or at the charge state 310-*a* (e.g., a logic 0), or at some other charge state.

When performing a read operation on a ferroelectric capacitor 240 at the charge state 310-*a* (e.g., a logic 0), additional negative charge may accumulate across the ferroelectric capacitor 240, and the charge state may follow path 340 until reaching the charge and voltage of the charge state 310-*c*. The amount of charge $\delta_{Q0}$ 345 flowing through the capacitor 240 may be related to the charge state and the read voltage 335.

When performing the read operation on the ferroelectric capacitor 240 at the charge state 305-*a* (e.g., a logic 1), the stored charge may reverse polarity as a net negative charge accumulates across the ferroelectric capacitor 240, and the charge state may follow the path 360 until reaching the charge and voltage of the charge state 305-*c*. The amount of charge $\delta_{Q1}$ 365 flowing through the ferroelectric capacitor 240 may again be related to the charge state and the read voltage 335. Accordingly, as shown by the transition between the charge state 305-*a* and the charge state 305-*c*, the amount of charge $\delta_{Q1}$ 365 may be different than the amount of charge $\delta_{Q0}$ 345, which may be detected by sense component 250.

In some cases, read operations may not change the remnant polarization of the ferroelectric capacitor 240 for the charge states 305-*a* and 310-*a*, and thus after performing the read operation the ferroelectric capacitor 240 may return to the charge state 310-*a* or 310-*a* via the reverse of path 340 or 360 when the read voltage 335 is removed (e.g., by applying a zero net voltage across the ferroelectric capacitor 240, by equalizing the voltage across the ferroelectric capacitor 240).

In some examples, a read operation may result in a reduction or a reversal of remnant polarization of the capacitor 240 that stored the charge state 305-*a* or 310-*a*. In other words, according to the properties of the ferroelectric material, after performing the read operation the ferroelectric capacitor 240 may not return to the charge state 305-*a* or 310-*a* when the read voltage 335 is removed. Rather, when applying a zero net voltage across the ferroelectric capacitor 240 after a read operation with read voltage 335, the charge state may result in an intermediate state (e.g., a less positively polarized charge state than initial charge state 305-*a*, a less negatively polarized charge state than initial charge state 310-*a*) However, in some sensing schemes, a reduced remnant polarization may still be read as the same stored logic state as a saturated remnant polarization state (e.g., supporting detection of a logic 0 or a logic 1 from both the charge states 305-*a* or 310-*a* and the intermediate charge states), thereby providing a degree of non-volatility for a memory cell 205 with respect to read operations.

The position of the charge state 305-*c* and the charge state 310-*c* after initiating a read operation may depend on one or more different factors, including the specific sensing scheme and circuitry. In some cases, the final charge and voltage may depend on the net capacitance of the digit line 215 coupled with the memory cell 205, which may include an intrinsic capacitance, capacitance associated with integrator capacitors, and other sources of capacitance. The position of the charge state 305-*c* and the charge state 310-*c* on hysteresis plot 300-*b* upon initiating a read operation may be determined through a load-line analysis. In other words, the charge states 305-*c* and 310-*c* may be defined with respect to the net capacitance of the digit line 215. As a result, the voltage of the ferroelectric capacitor 240 after initiating a read operation (e.g., voltage 350 when reading the ferroelectric capacitor 240 that stored the charge state 310-*a*, voltage 355 when reading the ferroelectric capacitor 240 that stored the charge state 305-*a*), may be different and may depend on the initial state of the ferroelectric capacitor 240.

In some cases, the initial state of the ferroelectric capacitor 240 may be determined by comparing the voltage of a digit line 215 (or of a sense line in the sense amplifier, where applicable) resulting from the read operation with a reference voltage (e.g., via a reference line 255 as described with reference to FIG. 2, or via a common access line). In some cases, the initial state of the ferroelectric capacitor 240 may be determined by current or charge sensing, such that the voltage of the digit line 215 is not used for comparing to the reference line 255. That is, the charge from the ferroelectric capacitor 240 may be sensed, and a resulting signal developed based on the charge (e.g., via an integrating circuit) may be compared with the reference voltage to determine the initial state of the ferroelectric capacitor 240.

During a sensing operation, the resulting signals from reading various memory cells 205 may be a function of manufacturing or operational variations between the various memory cells 205. For example, capacitors 240 of various memory cells 205 may have different levels of capacitance or saturation polarization, so that a logic 1 may be associated with different levels of charge from one memory cell to the next, and a logic 0 may be associated with different levels of charge from one memory cell to the next. These variations may provide challenges with reading the initial charge state of ferroelectric capacitor 240 with a sufficient margin to provide acceptable memory performance.

In some examples in accordance with the present disclosure, a cell selector component 245 of a non-selected memory cell 205 may be deactivated, but leakage charge (e.g., leakage current) may nonetheless flow through the deactivated cell selector components 245 during an access operation associated with a different, selected memory cell 205. This leakage current may increase the challenge in providing sufficient read margin in a memory array, particularly for increasing memory densities. According to various aspects, a memory device may include a compensation component 270 to compensate for leakage current on the digit line 215 during a read operation.

FIG. 4 illustrates an example of a circuit 400 that supports techniques for leakage compensation for memory arrays as disclosed herein. The circuit 400 illustrates a simplified circuit configuration that highlights several circuit components that work together during a read operation, as will be described in more detail with reference to FIGS. 5-6.

Circuit 400 includes digit line 215-*a* and multiple memory cells 205, including memory cells 205-*a*, 205-*b*. Memory cells 205-*a*, 205-*b* may be part of a larger memory array, such as memory array 170 described with reference to FIG. 1. Each memory cell 205-*a*, 205-*b* includes a corresponding cell capacitor 240-*a*, 240-*b* and cell selector component 245-*a*, 245-*b*. Digit line 215-*a*, memory cells 205-*a*, 205-*b*, and cell selector components 245-*a*, 245-*b* may be examples of digit line 215, memory cells 205, and cell selector components 245 described with reference to FIG. 2. The quantity of memory cells 205 in circuit 400 may vary and it may be desirable to increase an array size for a memory array by increasing the quantity of memory cells 205. Thus, circuit 400 may have many hundreds or thousands of memory cells 205 coupled with digit line 215-*a* via the corresponding cell selector components 245.

As previously discussed, a memory cell 205 may be configured to be selectively coupled with a digit line 215 by activating a cell selector component 245 of the memory cell 205. In some cases, a cell selector component 245 may be activated by activating (e.g., asserting, biasing) a word line (WL) signal on a word line 210 associated with the cell selector component 245. In some cases, cell selector component 245 may be a switching component that may include one or more transistors.

In some cases, selecting a memory cell (e.g., memory cell 205-*a*) and coupling the memory cell 205-*a* with digit line 215-*a* may cause an electric charge 465 to be transferred between a capacitor 240-*a* of the selected memory cell 205-*a* and digit line 215-*a*, as depicted in FIG. 4. The amount of charge transferred may depend on the logic state stored on memory cell 205-*a*. Thus, the charge transfer between cell capacitor 240-*a* and digit line 215-*a* may result in a signal (e.g., a charge signal, voltage signal, and/or current signal) on digit line 215-*a* that is related to the logic state stored by memory cell 205-*a*. Such a signal may be used, directly or indirectly (e.g., via a sense component) to determine a logic state stored by memory cell 205-*a*.

Circuit 400 includes compensation component 405. Compensation component 405 may be configured to compensate for noise (e.g., a leakage current) on digit line 215-*a* prior to or during (e.g., during at least a portion or phase of) a read operation of a memory cell 205.

In some cases, an output node 415 of compensation component 405 may be coupled with digit line 215-*a*; e.g., via conductive line 425. Although output node 415 is depicted as being directly coupled with digit line 215-*a*, in some cases, output node 415 may be coupled with digit line 215-*a* via one or more other components, such as through additional switching components, resistors, etc. For example, output node 415 may be coupled with digit line 215-*a* through an activated switching component, such as an activated transistor.

In some cases, an input node 420 of compensation component 405 may be configured to be selectively coupled with digit line 215-*a* through switching component 410. Switching component 410 may be activated (e.g., closed to create an electrical connection) by activating or biasing a switching signal SW. When switching component 410 is activated, input node 420 and output node 415 of compensation component 405 may be coupled with digit line 215-*a* and with each other, thereby creating a feedback loop.

Circuit 400 includes sense component 250-*a*, which may be an example of sense component 250 discussed with reference to FIGS. 1-2. Sense component 250-*a* may be configured to determine, during a read operation, a logic state stored by a target memory cell 205.

As previously discussed, in some cases, cell selector components 245 may permit leakage current to pass through cell selector components 245 onto digit line 215-*a* when cell selector components 245 are not selected or activated; e.g., when cell selector components 245 are in an off state. Such leakage current may introduce noise onto digit line 215-*a*, which may reduce the accuracy of read operations of memory cells 205.

Circuit 400 also includes a noise source 430, which may represent various sources of unwanted or undesirable current on digit line 215-*a* that may arise due to parasitic effects, leakage currents from components other than memory cells 205, crosstalk, etc.

In some cases, compensation component 405 may be configured to compensate for noise (e.g., unwanted current, leakage current) introduced onto digit line 215-*a* by unselected cell selector components 245 and/or by noise source 430.

In some cases, a read operation of a target memory cell may include coupling the compensation component 405 with the digit line 215-*a* (e.g., by activating switching component 410) before coupling the target memory cell 205 with the digit line 215-*a*. Compensation component 405 may sample a leakage current on digit line 215-*a* that may be present on the digit line 215-*a* before the target memory cell 205 is coupled with the digit line 215-*a*. In some cases, the sampled leakage current may include the sum of the leakage currents associated with non-target memory cells 205, and may also include the leakage current associated with the target memory cell 205.

In some cases, compensation component 405 may store a representation of the sampled leakage current before coupling the target memory cell 205 with the digit line 215-*a*. In some cases, compensation component 405 may store the representation of the leakage current by storing a voltage representing the leakage current on a capacitor, for example. In some cases, the voltage on the capacitor may be based on the leakage current; that is, the leakage current may induce or cause the voltage to be developed across the capacitor.

In some cases, compensation component 405 may output a current on the digit line 215-*a* based on the representation of the leakage current. In some cases, compensation component 405 may output the current on the digit line 215-*a* by sinking (e.g., removing, diverting) the current from the digit line 215-*a*, or by sourcing (e.g., providing, supplying, adding) the current to the digit line 215-*a*. In some cases, the compensation component 405 may output a current that is based on the stored representation of the leakage current and may be substantially equivalent to the leakage current, but with an opposite polarity of the leakage current. Thus, in some cases, outputting the current to the digit line 215-*a* may substantially eliminate or reduce the leakage current on the digit line 215-*a* based on the leakage current sampled on digit line 215-*a* before the target memory cell 205 is coupled with the digit line 215-*a*.

As previously noted, in some cases, the representation of the leakage current may include the leakage current associated with the target memory cell as well as the leakage current associated with the non-target memory cells. For this and other reasons, the leakage current sampled during the first phase of the read operation may not be identical to the leakage current on the digit line during the second phase of the read operation. Such differences are assumed to be substantially negligible, but may be compensated for if desired, such as by scaling the output current of the compensation component by a fraction of the unselected cells or by another factor during the read operation. For example, the scaling factor may be dependent upon a leakage current probability distribution.

In some cases, compensation component 405 may output the current on the digit line 215-*a* before and/or after the target memory cell 205 is coupled with the digit line 215-*a* during the read operation. That is, in some cases, compensation component 405 may begin outputting a current on the digit line 215-*a* before the target memory cell 205 is coupled with the digit line 215-*a*, and compensation component 405 may continue to output a current on the digit line 215-*a* after the target memory cell 205 is coupled with the digit line 215-*a* to compensate for the leakage current during the read operation. In some cases, the sense component 250-*a* may determine the logic state of the memory cell based on the signal on the digit line while the compensation component 405 is outputting a current to the digit line 215-*a*.

In some cases, as described in more detail with reference to FIGS. 5-6, an input node 420 of compensation component 405 may be coupled with digit line 215-*a* during a first phase of a read operation (before the target memory cell 205 is coupled with the digit line 215-*a*) to sample and store a representation of the leakage current on digit line 215-*a*. The input node 420 may be decoupled from digit line 215-*a* during a second phase of a read operation (after the target memory cell 205 is coupled with digit line 215-*a*) during which the compensation component 405 may continue to output a current to digit line 215-*a* based on the stored representation of the leakage current.

In some cases, input node 420 of compensation component 405 may be coupled with digit line 215-*a* during the first phase of each of multiple read operations. Alternatively, input node 420 of compensation component 405 may be coupled with digit line 215-*a* during the first phase of a subset of multiple read operations, while other read operations may use a previously stored representation of the leakage current on a digit line (e.g., where multiple sequential read operations are applied to the same set of digit lines 215).

Figure 5:
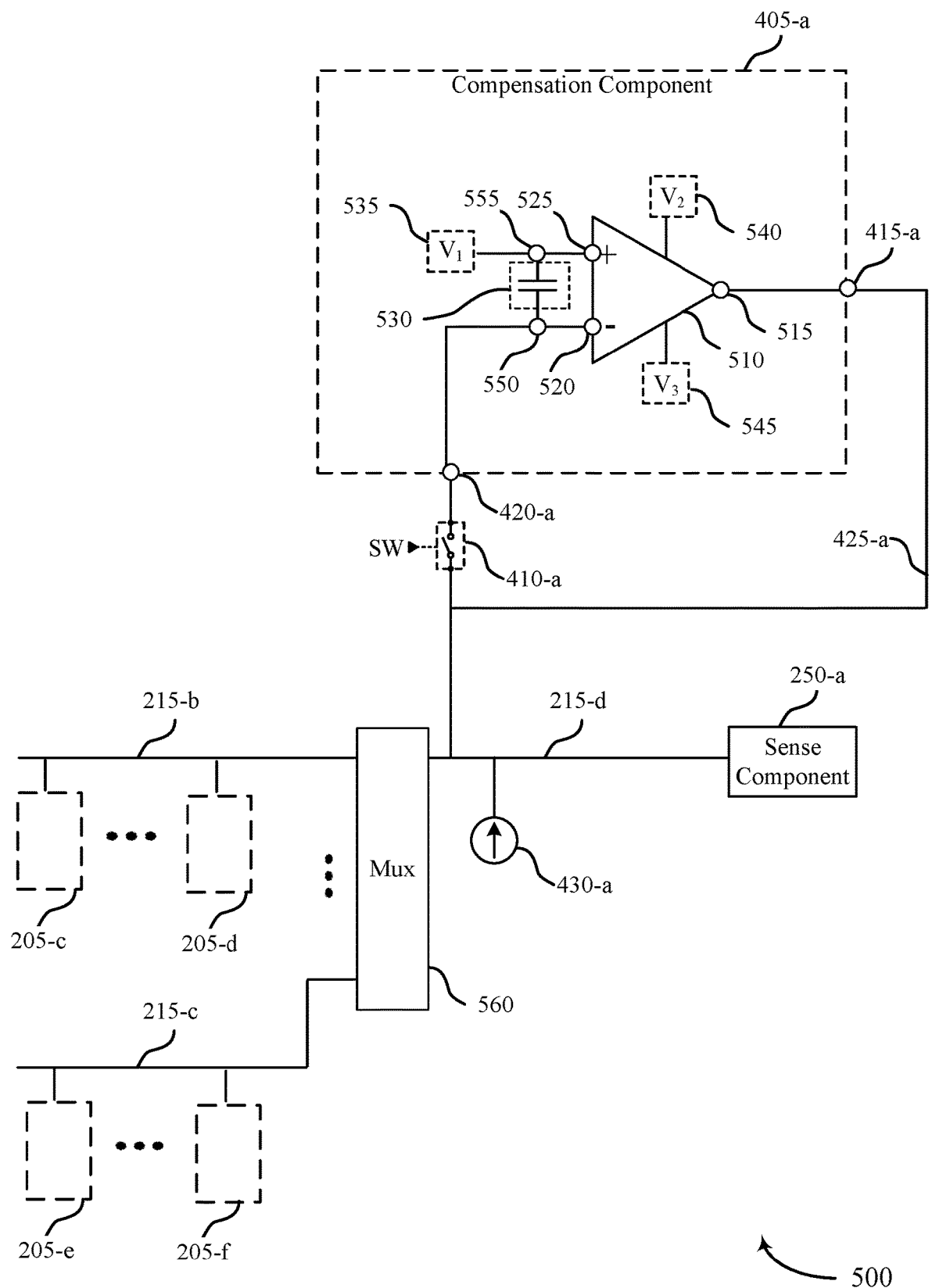
FIG. 5 illustrates an example circuit that supports leakage compensation for memory arrays as disclosed herein.

FIG. 5 illustrates an example of a circuit 500 that supports techniques for leakage compensation for memory arrays as disclosed herein. The circuit 500 illustrates a simplified circuit configuration that highlights several circuit components that may work together during a read operation, as will be described in more detail with respect to FIG. 6.

Circuit 500 includes compensation component 405-*a*, which may be an example of compensation component 405 described with reference to FIG. 4. An output node 415-*a* of compensation component 405-*a* is coupled with digit line 215-*d*. An input node 420 of compensation component 405-*a* is configured to be selectively coupled with digit line 215-*d* via switching component 410.

Optionally, digit line 215-*d* may be selectively coupled with one of multiple digit lines, including digit line 215-*b*, 215-*c*, via multiplexer 560. In some cases, multiplexer 560 may select a target digit line for coupling with digit line 215-*d*. Thus, in some cases, digit line 215-*d* corresponds to one of multiple digit lines 215. In some cases, multiplexer 560 may be used to enable a sense component 250-*a* and/or compensation component 405-*a* to be shared among multiple digit lines 215. Such component sharing may be possible for memory devices based on ferroelectric memory cells because unselected ferroelectric memory cells may be biased such that both plates of the capacitor in the ferroelectric memory cell are at the same or essentially the same voltage (e.g., the plate line voltage) to reduce unselected cell leakage and maintain the state of unselected cells. In contrast, a memory device based on DRAM cells may not include a multiplexor 560 because DRAM cells may involve a sense component for each digit line to refresh the state of the DRAM cells.

Circuit 500 includes multiple memory cells 205, including memory cells 205-c, 205-d, 205-e, and 205-f, which may be coupled with associated digit lines 215 including digit lines 215-b, 215-c.

Compensation component 405-a includes transconductance circuit 510, which may be configured to output a current at an output node 515 of transconductance circuit 510 based on a voltage across a first input node 520 of transconductance circuit 510 and a second input node 525 of transconductance circuit 510. That is, in some cases, transconductance circuit 510 may output a current at output node 515 that is proportional to the voltage across input nodes 520, 525. In some cases, first input node 520 may be referred to as an inverted node and second input node 525 may be referred to as a non-inverted node. In some cases, connecting output node 515 with input node 520 (e.g., via switching component 410) may establish a feedback loop (e.g., a negative feedback loop) through transconductance circuit 510. In some cases, transconductance circuit 510 may be or may include a transconductance amplifier.

In some cases, output node 515 of transconductance circuit 510 is coupled with or is the same as output node 415-a of compensation component 405-a. In some cases, first input node 520 of transconductance circuit 510 is coupled with or is the same as input node 420 of compensation component 405-a.

Transconductance circuit 510 may be coupled with a first voltage source 540 and a second voltage source 545 to provide power to transconductance circuit 510. First voltage source 540 and second voltage source 545 may provide voltages that are selected to enable a desired operating range of transconductance circuit 510. For example, the first voltage source 540 may supply approximately 1.0 volts, and the second voltage source may supply approximately –0.6 volts. Other voltage supply values are possible.

In some cases, output node 515 may source a current when the voltage across input nodes 520, 525 is positive (input node 525 has a higher voltage than input node 520) and output node 515 may sink a current when the voltage across input nodes 520, 525 is negative. Thus, transconductance circuit 510 may source or sink a current based on the polarity of the voltage across input nodes 520, 525. Transconductance circuit 510 may include a driver, such as a current driver, for outputting the current.

Compensation component 405-a includes capacitor 530. A first node 550 of capacitor 530 may be coupled with first input node 520 of transconductance circuit and with switching component 410. A second node 555 of capacitor 530 may be coupled with second input node 525 of transconductance circuit 510. Thus, capacitor 530 may be coupled across the input nodes 520, 525 of transconductance circuit 510.

In some cases, second input node 525 of transconductance circuit 510 may be coupled with a voltage source 535, which may be a pre-charge voltage source for pre-charging digit line 215-d during a read operation of a memory cell 205. In some cases, digit line 215-d may initially be pre-charged to a first voltage by directly coupling voltage source 535 with digit line 215-d by activating a switching component between voltage source 535 and digit line 215-d (not shown). The switching component may then be deactivated, and voltage source 535 may continue to be used to pre-charge digit line 215-d indirectly via transconductance circuit 510, such that transconductance circuit 510 may source or sink the leakage current on digit line 215-d.

Circuit 500 includes sense component 250-a for determining the state stored by a target memory cell during a read operation. Sense component 250-a may determine the state based on a signal on digit line 215-d. In some cases, sense component 250-a may be directly coupled or connected with digit line 215-d, while in other cases sense component 250-a may be coupled with digit line 215-d via one or more additional components, such as switching components, capacitors, amplifiers, etc.

During a read operation, compensation component 405-a may compensate for leakage current on digit line 215-d as follows.

In a first phase of the read operation (e.g., before coupling a target memory cell 205 with digit line 215-d, potentially by way of multiplexer 560), switching component 410 may be activated to couple the first node 550 of capacitor 530 and the first input node 520 of transconductance circuit 510 with digit line 215-d, thereby establishing a feedback loop via conductive line 425-a. The second input node 525 of transconductance circuit and the second node of capacitor 530 may be coupled with voltage source 535, which may provide a pre-charge voltage to transconductance circuit 510 for pre-charging digit line 215-d prior to coupling the target memory cell with digit line 215-d. During this phase, the voltage of a plate line (e.g., plate line 220) associated with the target memory cell may be set to a high voltage (e.g., 1.5 volts) and the digit line 215-d may be pre-charged to a different voltage, such as 0 volts using the compensation component 405-a to bias the circuit in preparation for the read operation.

During the first phase, leakage current from unselected memory cells 205 and/or other unwanted current from noise source 430 may be flowing onto digit line 215-d. As the transconductance circuit is connected in a feedback loop, capacitor 530 may begin to build a voltage across capacitor 530 that is proportional therefore to the current flowing into (or out of) output node 515 of transconductance circuit 510 (and therefore proportional to the amount of leakage current on digit line 215-d). Thus, the voltage across capacitor 530 may be based on the leakage current on digit line 215-d.

After a period of time, circuit 500 may approach or may reach an equilibrium condition (e.g., may approach or reach a steady state) in which the leakage current flowing into or out of output node 515 is substantially constant, and the corresponding voltage across capacitor 530 is also substantially constant; that is, the current flowing into/out of output node 515 and/or the voltage across capacitor 530 may reach a steady state. The voltage of digit line 215-d may also be substantially constant, and may be approximately equal to the pre-charge voltage supplied by voltage source 535.

In some cases, capacitor 530 may be pre-charged to an initial voltage before switching component 410 is activated. Pre-charging capacitor 530 may enable the circuit 500 to reach an equilibrium condition more quickly during the first phase of the read operation, for example.

At the end of the first phase of the read operation, switching component 410 may be deactivated to decouple the first node 550 of capacitor 530 and first node 520 of transconductance circuit 510 from digit line 215-d. At this point, the voltage across capacitor 530—and therefore, the voltage across input nodes 520, 525 of transconductance circuit 510—may be a voltage that represents (e.g., may be based on or proportional to) the leakage current present on the digit line 215-d before the target memory cell 205 is coupled with the digit line 215-d. Thus, a representation of the leakage current may be stored as a voltage on capacitor 530. Because capacitor 530 is now decoupled from digit line 215-d, the voltage on capacitor 530 will remain substantially constant, assuming negligible charge leakage away from capacitor 530.

A second phase of the read operation may begin when the target memory cell 205 is coupled with digit line 215-d (potentially by way of multiplexer 560). The target memory cell 205 may be coupled with the digit line 215-d by, for example, activating a cell selector component 245 of the target memory cell 205, such as described with reference to FIG. 2. After the target memory cell 205 is coupled with the digit line 215-d, the target memory cell 205 may begin transferring charge with the digit line 215-d, thereby causing a signal (e.g., a voltage) to develop on digit line 215-d. The signal may depend on or may represent the logic state stored by the target memory cell 205.

During the second phase of the read operation, while the target memory cell 205 is coupled with the digit line 215-d, transconductance circuit 510 may continue to output (e.g., to sink or source) a current to digit line 215-d based on the voltage across input nodes 520, 525—e.g., based on the representation of the leakage current stored on capacitor 530. In this manner, transconductance circuit 510 may substantially compensate for (e.g., remove) the leakage current from digit line 215-d such that the signal developed on digit line 215-d is primarily or entirely due to charge transfer from the target memory cell 205; that is, the signal on digit line 215-d may exclude some or all of the leakage current.

Sense component 250-a may then determine the logic state stored by the target memory cell 205 by comparing the signal on digit line 215-d with a reference value as described with reference to FIG. 2, for example. In some cases, a controller may enable the sense component 250-a to determine the logic state by activating or firing the sense component by asserting a control signal, for example, or in another manner.

Figure 6:
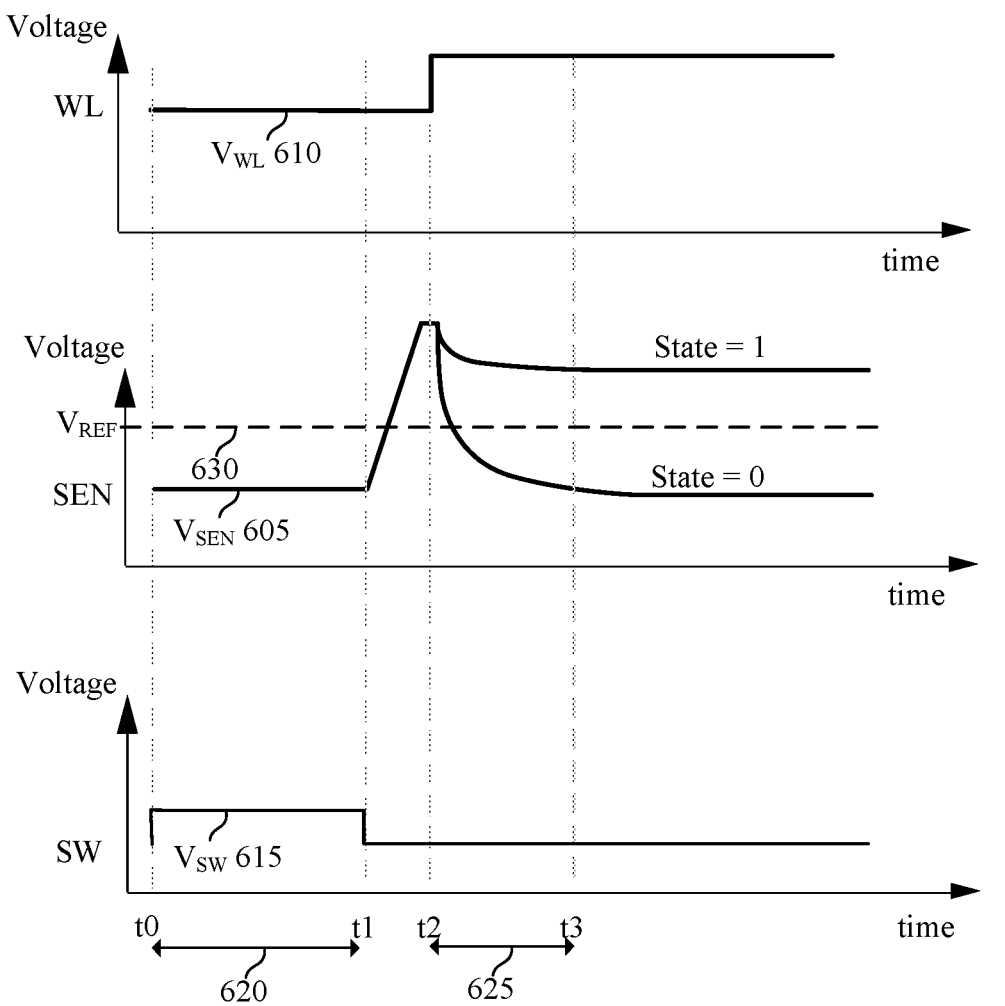
FIG. 6 illustrates an example timing diagram that supports leakage compensation for memory arrays as disclosed herein.

FIG. 6 illustrates an example of a timing diagram 600 that supports leakage compensation for memory arrays as disclosed herein. Timing diagram 600 illustrates a voltage $V_{SEN}$ associated with a signal on digit line 215 during a read operation. $V_{SEN}$ 605 shows a sense voltage that may be generated (e.g., by a sense amplifier) based on a signal (e.g., a voltage signal, a current signal, a charge signal) on digit line 215 during a read operation, for example. In some cases, a sense component may receive a signal on digit line 215 and may amplify the signal to generate $V_{SEN}$ 605, which may then be compared to a reference voltage. Such amplification may provide a larger sense window (e.g., a larger difference between a "1" state voltage and a "0" state voltage) for determining the state of the selected memory cell. In some cases, an electric charge from a selected ferroelectric memory cell may be transferred between the cell capacitor and an integrating capacitor in the sense component via digit line 215 during a read operation. Such charge transfer may cause a voltage to develop across the integrating capacitor in the sense component. The developed voltage across the integrator capacitor may depend on the state stored by the selected memory cell, and may be compared with a reference voltage to determine the state. In this case, $V_{SEN}$ 605 may represent the voltage across the integrating capacitor or the voltage at a node of the integrating capacitor (e.g., an output of a signal development circuit including the integrating capacitor).

Timing diagram 600 also illustrates a voltage $V_{WL}$ of a word line signal WL that may be used to activate a cell selector component (e.g., cell selector component 245) to couple a target memory cell with the digit line during the read operation, and a voltage $V_{SW}$ of a switching signal SW that may be used to activate a switching component (e.g., switching component 410) to couple a compensation component (e.g., compensation component 405, 505) with a digit line. The polarities shown for signals in FIG. 6 are shown as a positive value closing a switching component or activating a cell selector component, and may be reversed without loss of meaning for different types of switching components and cell selector components.

The timing diagram 600 may illustrate operation of a circuit similar to the circuits 400, 500 described with reference to FIGS. 4-5. Thus, timing diagram 600 may illustrate the operation of one or more components described herein with reference to FIGS. 1-5. For example, timing diagram 600 may illustrate the voltage $V_{SEN}$ 605 associated with a signal on the digit line (e.g., digit line 215, 215-a, 215-d) received by or applied to a sense component (e.g., sense component 250, 250-a as described with reference to FIGS. 1-5) during a read operation of a memory cell.

In the example of timing diagram 600, a memory cell 205 may initially store a logic state (e.g., a logic 0 state, a logic 1 state) as described herein. Certain signals illustrated in the timing diagram 600 are therefore shown as alternatives associated with reading the different logic states, as indicated by the notation state=1 or state=0 (e.g., as associated with the respective logic states) where such signals are different.

In some examples, the read operation illustrated by timing diagram 600 may begin at t0 with an initial state in which a word line 210 associated with the target memory cell 205 is not asserted (e.g., logical signal WL is deactivated) and the voltage of the digit line 215 may be floating, or may be set to a predetermined voltage that may the same as the plate voltage, for example. A switching component (e.g., switching component 410) may be deactivated such that a first input node of a compensation component 405, 405-a may not be coupled with the digit line.

At time t0, a first phase 620 of the read operation may begin, as described with respect to FIGS. 4-5. At t0, a switching component (e.g., switching component 410) may be activated by asserting switching signal SW (e.g., by raising voltage $V_{SW}$ 615) to couple an input node 420 of a compensation component (e.g., compensation component 405, 405-a) with the digit line 215. In the example depicted in FIG. 5, during first phase 620, compensation component 405-a outputs (sinks or sources) a current to the digit line based on the voltage across the capacitor 530. In the example of compensation component 405-a, the transconductance circuit 510 is connected in a negative feedback loop during the first phase, and thus attempts to maintain a zero-voltage difference across input nodes 520, 525 by sinking or sourcing an output current to drive first node 520 to the same voltage as second node 525 (e.g., to the pre-charge voltage supplied by voltage source 535, which may be 0 volts).

During the first phase 620, a plate line associated with the target memory cell may be set to a high voltage, such as 1.5 volts, and the digit line may be pre-charged to a different voltage, such as 0 volts. In this case, if the cell selector components are n-type metal-oxide-semiconductor (NMOS) transistors (for example), all of the sources of the cell selector components may be at the plate voltage (e.g., 1.5 volts) and the drain may be set to the digit line voltage (e.g., 0 volts). It should be understood that for some types of transistors or implementations, the drain and source may be reversed. Thus, there may be leakage current through the cell selector components onto the digit line due to imperfections in the transistors and because the drains and sources are set to different voltages.

At or near the end of first phase 620, circuit 500 may have reached an equilibrium condition in which the current that is output by the compensation component 405, 405-a is substantially constant and compensating for the leakage current through the cell selector components, and the voltage of the digit line may have been pre-charged to an initial voltage, such as at or near 0 volts, using the compensation component 405, 405-a. Thus, $V_{SEN}$ 605 may also be at or near 0 volts. In the example of FIG. 5, the voltage across the capacitor 530 of the compensation component 405-a may also be substantially constant. Thus, by time t1, the compensation component 405, 405-a may have settled on a representation of the leakage current as, for example a voltage across a capacitor 530. The compensation component 405, 405-a may be configured to compensate for the leakage current by outputting a current to the digit line 215 based on the stored representation of the leakage current.

At time t1, the switching component 410 may be deactivated by de-asserting switching signal SW (e.g., by lowering voltage $V_{SW}$ 615), thereby decoupling the input node of 420 the compensation component 405, 405-a from the digit line. In the example depicted in FIG. 5, deactivating switching component 410 decouples capacitor 530 from the digit line 215-d and stores the representation of the leakage current on capacitor 530.

At time t2, a second phase 625 of the read operation may begin, as described with respect to FIGS. 4-5. At time t2, a word line signal WL may be asserted (e.g., by raising $V_{WL}$ 610) to couple a target memory cell 205 with the digit line 215. The word line signal WL may be coupled with (e.g., may drive) a gate of a cell selector component 245 of the target memory cell 205, for example.

After time t2, a signal may begin to develop on the digit line (e.g., charge may begin to be transferred between the selected memory cell and the digit line) thereby causing a voltage $V_{SEN}$ 605 to develop based on the state stored by the target memory cell 205. During the second phase, the compensation component 405, 405-a may continue to compensate for leakage current on the digit line 215 by outputting a current to the digit line 215 based on the stored representation of the leakage current; e.g., based on the voltage of capacitor 530.

At time t3, a sense component 250 may determine a logic state stored by the target memory cell 205. The sense component may determine (e.g., sense) the logic state by comparing $V_{SEN}$ 605 with a reference voltage $V_{REF}$ 630, for example. If $V_{SEN}$ is higher than $V_{REF}$, for example, the sense component may determine that the logic state is a "1," and if $V_{SEN}$ is lower than $V_{REF}$, the sense component may determine that the logic state is a "0."

Figure 7:
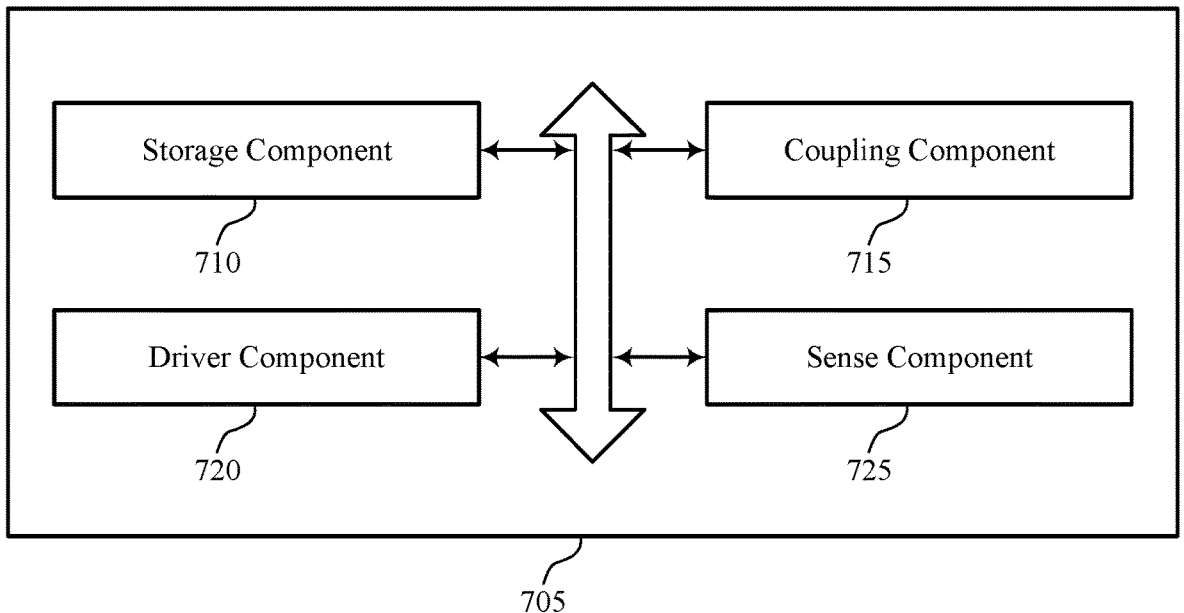
FIG. 7 shows a block diagram of a device that supports leakage compensation for memory arrays as disclosed herein.

FIG. 7 shows a block diagram 700 of a device 705 that supports leakage compensation for memory arrays as disclosed herein. The device 705 may include a storage component 710, a coupling component 715, a driver component 720, and a sense component 725. Each of these components may communicate, directly or indirectly, with one another (e.g., via one or more buses, conductive lines, etc.).

The storage component 710 may store, during a first phase of a read operation of a target memory cell, a representation of a leakage current for a digit line. In some cases, storage component 710 may store the representation using a capacitor, for example.

The coupling component 715 may couple, during a second phase of the read operation, the target memory cell with the digit line. In some cases, the coupling component 715 may couple the target memory cell with the digit line by activating a word line signal associated with the target memory cell, for example, to activate a cell selector component of the target memory cell.

The driver component 720 may output, during the second phase of the read operation, a current on the digit line based on the representation of the leakage current. In some cases, the driver component 720 may output the current on the digit line by sinking the current from the digit line or sourcing the current to the digit line. In some cases, the driver component 720 may output a current that may be adjusted to be a fraction of the leakage current.

The sense component 725 may determine a logic state stored by the target memory cell based on a signal on the digit line during the second phase of the read operation.

Figure 8:
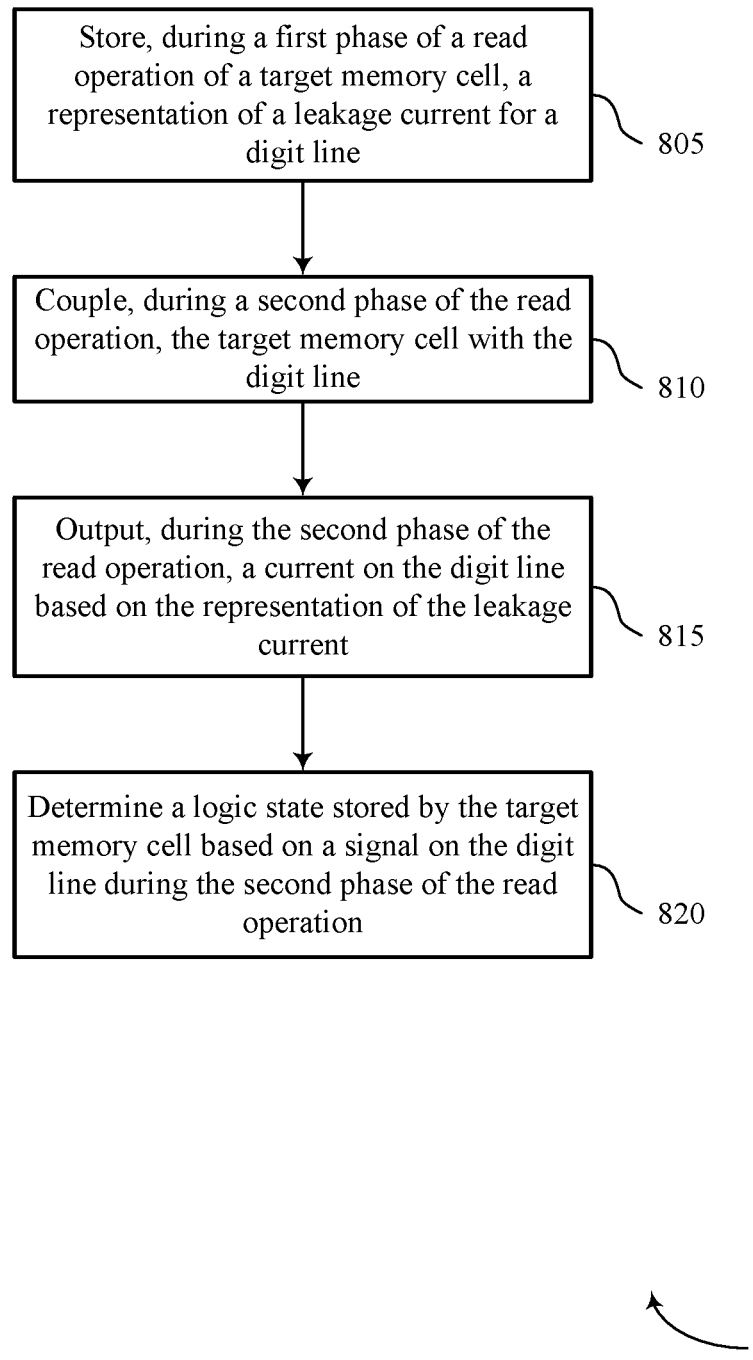
FIG. 8 shows a flowchart illustrating a method or methods that support leakage compensation for memory arrays as disclosed herein.

FIG. 8 shows a flowchart illustrating a method 800 that supports leakage compensation for memory arrays as disclosed herein. The operations of method 800 may be implemented by a controller or its components as described herein. For example, the operations of method 800 may be performed by a controller (e.g., a local memory controller, device memory controller, external memory controller, or host controller) as described with reference to FIGS. 1-6. In some examples, a controller may execute a set of instructions to control the functional elements of a memory device to perform the functions described below. Additionally or alternatively, a controller may perform portions of the functions described below using special-purpose hardware.

At 805, the controller may cause the memory device to store, during a first phase of a read operation of a target memory cell, a representation of a leakage current for a digit line. The operations of 805 may be performed according to the methods described herein. In some examples, portions of the operations of 805 may be performed by a storage component as described with reference to FIG. 7.

At 810, the controller may cause the memory device to couple, during a second phase of the read operation, the target memory cell with the digit line. The operations of 810 may be performed according to the methods described herein. In some examples, portions of the operations of 810 may be performed by a coupling component as described with reference to FIG. 7.

At 815, the controller may cause the memory device to output, during the second phase of the read operation, a current on the digit line based on the representation of the leakage current. The operations of 815 may be performed according to the methods described herein. In some examples, portions of the operations of 815 may be performed by a driver component as described with reference to FIG. 7.

At 820, the controller may cause the memory device to determine a logic state stored by the target memory cell based on a signal on the digit line during the second phase of the read operation. The operations of 820 may be performed according to the methods described herein. In some examples, portions of the operations of 820 may be performed by a sense component as described with reference to FIG. 7.

It should be noted that the method or methods described above describe possible implementations, and that the operations and the steps may be rearranged or otherwise modified and that other implementations are possible. Furthermore, portions from two or more of the methods may be combined.

In some examples, an apparatus or apparatuses as described herein may perform a method or methods, such as method 800. The apparatus may include features, controllers, circuits, means, or instructions (e.g., a non-transitory computer-readable medium storing instructions executable by a processor) for storing, during a first phase of a read operation of a target memory cell, a representation of a leakage current for a digit line; coupling, during a second phase of the read operation, the target memory cell with the digit line; outputting, during the second phase of the read operation, a current on the digit line based at least in part on the representation of the leakage current, and determining a logic state stored by the memory cell based at least in part on a signal on the digit line during the second phase of the read operation. In some cases, outputting the current on the digit line includes sinking the current from or sourcing the current to the digit line using a compensation component coupled with the digit line. In some cases, storing the representation of the leakage current includes storing, on a capacitor of the compensation component, a voltage based at least in part on the leakage current, where activating the switching component couples the digit line with a node of the capacitor.

Some examples of the method, apparatuses, and non-transitory computer-readable medium described herein may further include operations, features, controllers, circuits, means, or instructions for activating, during the first phase, a switching component to couple the digit line with an input node of the compensation component, wherein the digit line is coupled with an output node of the compensation component.

Some examples of the method, apparatuses, and non-transitory computer-readable medium described herein may further include operations, features, controllers, circuits, means, or instructions for deactivating the switching component to decouple the digit line from the capacitor before coupling the target memory cell with the digit line.

In some cases, the compensation component includes a transconductance circuit for outputting the current to the digit line.

In some cases, the digit line is associated with multiple memory cells, including the target memory cell, and the leakage current includes a leakage current associated with the multiple memory cells.

In some cases, coupling the target memory cell with the digit line causes the signal on the digit line to change based at least in part on the logic state stored by the target memory cell.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and include a three terminal device including a source, drain, and gate.

The terminals may be connected to other electronic elements through conductive materials, e.g., metals. The source and drain may be conductive and may include a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a plurality of memory cells configured to couple with an access line; and a controller configured to cause the apparatus to:
    couple, during a read operation of a target memory cell, the target memory cell of the plurality of memory cells with the access line;
    output, during the read operation, a current on the access line based at least in part on a representation of a leakage current for the access line, wherein the representation of the leakage current is different from the leakage current for the access line during the read operation; and
    determine a logic state stored by the target memory cell based at least in part on a signal on the access line during the read operation.

2. The apparatus of claim 1, wherein, to output the current on the access line, the controller is configured to cause the apparatus to:
    sink the current from or sourcing the current to the access line using a compensation component coupled with the access line.

3. The apparatus of claim 2, wherein the controller is configured to cause the apparatus to:
    activate, during a first phase of the read operation before coupling the target memory cell with the access line, a switching component to couple the access line with an input node of the compensation component, wherein the access line is coupled with an output node of the compensation component.

4. The apparatus of claim 3, wherein, to store the representation of the leakage current, the controller is configured to cause the apparatus to:
    store, on a capacitor of the compensation component, a voltage based at least in part on the leakage current, wherein activating the switching component couples the access line with a node of the capacitor.

5. The apparatus of claim 4, wherein the controller is configured to cause the apparatus to:
    deactivate the switching component to decouple the access line from the capacitor before the target memory cell is coupled with the access line.

6. The apparatus of claim 2, wherein:
    the compensation component comprises a transconductance amplifier; and
    the controller is further configured to cause the apparatus to output the current on the access line using the transconductance amplifier.

7. The apparatus of claim 1, wherein:
    the plurality of memory cells comprise a plurality of transistors;
    the leakage current corresponds to a first sum of off-state currents through respective channels of the plurality of transistors that excludes an off-state current through a channel of a transistor of the target memory cell based at least in part on coupling the target memory cell with the access line during the read operation; and
    the representation of the leakage current corresponds to a second sum of off-state currents through respective channels of the plurality of transistors that includes the off-state current through the channel of the transistor of the target memory cell.

8. The apparatus of claim 1, wherein:
    the plurality of memory cells comprise a plurality of cell selector components for coupling the plurality of memory cells with the access line;
    the leakage current corresponds to a first sum of leakage currents associated with the plurality of cell selector components that excludes a leakage current associated with the target memory cell based at least in part on coupling the target memory cell with the access line during the read operation; and
    the representation of the leakage current corresponds to a second sum of leakage currents associated with the plurality of cell selector components that includes the leakage current associated with the target memory cell.

9. The apparatus of claim 1, further comprising:
    a multiplexer coupled with a plurality of access lines comprising the access line, wherein the controller is configured to cause the apparatus to couple the target memory cell with the access line using the multiplexer.

10. An apparatus, comprising:
    an access line;
    a plurality of memory cells configured to couple with the access line;
    a compensation component coupled with the access line and configured to output, during a read operation of a target memory cell of the plurality of memory cells, a current on the access line based at least in part on a representation of a leakage current for the access line, wherein the representation of the leakage current is different from the leakage current for the access line during the read operation; and
    a sense component coupled with the access line and configured to determine, after the target memory cell is coupled with the access line, a logic state stored by the target memory cell based at least in part on a signal on the access line.

11. The apparatus of claim 10, wherein the compensation component is configured to store, prior to the target memory cell being coupled with the access line, the representation of the leakage current.

12. The apparatus of claim 10, further comprising:
    a switching component configured to couple with an input node of the compensation component with the access line.

13. The apparatus of claim 12, wherein the compensation component comprises a transconductance amplifier configured to output the current on the access line by sinking or sourcing the current through an output node of the transconductance amplifier.

14. The apparatus of claim 10, wherein:
    the plurality of memory cells comprises a plurality of cell selector components for coupling the plurality of memory cells with the access line;
    the leakage current comprises a first combination of leakage currents associated with the plurality of cell selector components that excludes a leakage current associated with the target memory cell; and
    the representation of the leakage current comprises a second combination of leakage currents associated with the plurality of memory cells that includes the leakage current associated with the target memory cell.

15. A method, comprising:
    coupling, during a read operation of a target memory cell, an access line with an input node of a compensation component configured to output a current on the access line to compensate for a leakage current on the access line;
    decoupling the input node of the compensation component from the access line based at least in part on the compensation component storing a representation of the leakage current; and
    coupling, based at least in part on decoupling the input node from the access line, the target memory cell with the access line to sense a logic state stored by the target memory cell based at least in part on a signal on the access line during the read operation.

16. The method of claim 15, further comprising:
coupling the input node of the compensation component with the access line by activating a switching component; and
decoupling the input node of the compensation component from the access line by deactivating the switching component.

17. The method of claim 15, wherein:
the compensation component comprises a transconductance amplifier and a capacitor coupled between a first input node of the transconductance amplifier and a second input node of the transconductance amplifier; and
an output node of the transconductance amplifier is coupled with the access line.

18. The method of claim 17, wherein:
the representation of the leakage current comprises a voltage across the capacitor; and
the transconductance amplifier is configured to output the current to the access line based at least in part on the voltage across the capacitor.

19. The method of claim 15, wherein:
a plurality of memory cells each configured to couple with the access line comprise a plurality of transistors;
the leakage current corresponds to a first sum of off-state currents through respective channels of the plurality of transistors that excludes an off-state current through a channel of a transistor of the target memory cell based at least in part on coupling the target memory cell with the access line during the read operation; and
the representation of the leakage current corresponds to a second sum of off-state currents through respective channels of the plurality of transistors that includes the off-state current through the channel of the transistor of the target memory cell.

20. The method of claim 15, wherein:
a plurality of memory cells configured to couple with the access line comprise a plurality of cell selector components for coupling the plurality of memory cells with the access line;
the leakage current corresponds to a first sum of leakage currents associated with the plurality of cell selector components that excludes a leakage current associated with the target memory cell based at least in part on coupling the target memory cell with the access line during the read operation; and
the representation of the leakage current corresponds to a second sum of leakage currents associated with the plurality of cell selector components that includes the leakage current associated with the target memory cell.

* * * * *